(12) United States Patent
Henneguet

(10) Patent No.: US 12,126,271 B2
(45) Date of Patent: Oct. 22, 2024

(54) ELECTRONIC CONTROL SYSTEM FOR ELECTRIC MACHINE AND ELECTRIC ASSEMBLY

(71) Applicant: VALEO EQUIPEMENTS ELECTRIQUES MOTEUR, Creteil (FR)

(72) Inventor: Romain Henneguet, Creteil (FR)

(73) Assignee: VALEO EQUIPEMENTS ELECTRIQUES MOTEUR, Creteil (FR)

( * ) Notice: Subject to any disclaimer, the term of this patent is extended or adjusted under 35 U.S.C. 154(b) by 269 days.

(21) Appl. No.: 17/612,424

(22) PCT Filed: May 11, 2020

(86) PCT No.: PCT/EP2020/063085
§ 371 (c)(1),
(2) Date: Nov. 18, 2021

(87) PCT Pub. No.: WO2020/234029
PCT Pub. Date: Nov. 26, 2020

(65) Prior Publication Data
US 2022/0209678 A1  Jun. 30, 2022

(30) Foreign Application Priority Data

May 20, 2019 (FR) ..................... 19 05245

(51) Int. Cl.
*H02M 7/00* (2006.01)
*H02K 11/25* (2016.01)
(Continued)

(52) U.S. Cl.
CPC ............ *H02M 7/003* (2013.01); *H02K 11/25* (2016.01); *H02K 11/27* (2016.01); *H02K 11/33* (2016.01);
(Continued)

(58) Field of Classification Search
CPC .... H02M 7/003; H02M 1/0009; H02M 7/537; H02K 11/25; H02K 11/27; H02K 11/33;
(Continued)

(56) References Cited

U.S. PATENT DOCUMENTS

| 2008/0049477 A1* | 2/2008 | Fujino ................. H02M 7/5387 323/272 |
| 2008/0130223 A1* | 6/2008 | Nakamura ......... H05K 7/20927 361/689 |
| 2016/0105067 A1* | 4/2016 | Bradfield ................. H02K 5/18 310/59 |

FOREIGN PATENT DOCUMENTS

| EP | 1 919 069 A2 | 5/2008 |
| WO | WO 2013/015371 A1 | 1/2013 |
| WO | WO2013015371 | * 1/2013 |

OTHER PUBLICATIONS

International Search Report issued on Jul. 16, 2020 in PCT/EP2020/063085 filed May 11, 2020, 2 pages.

* cited by examiner

*Primary Examiner* — Ahmed Elnakib
(74) *Attorney, Agent, or Firm* — Oblon, McClelland, Maier & Neustadt, L.L.P.

(57) ABSTRACT

Electronic control system for electric machine and electric assembly. The electronic system includes an electronic power module for converting a DC current into an AC current, and an electronic control module configured to generate a control signal for the electronic power module. The electronic control module includes a first electronic sub-assembly including at least a first trace and at least one electronic control component, the at least one electronic control component being electrically connected to the at least one first trace. A second electronic sub-assembly, separate from the first electronic sub-assembly, includes an (Continued)

Figure 1:
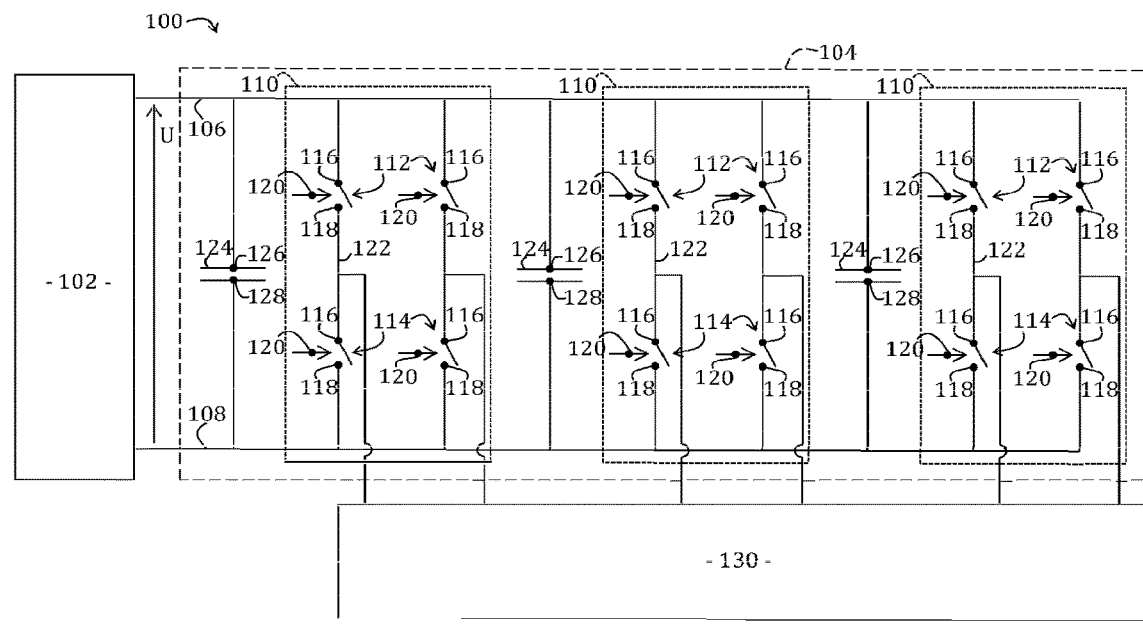

electronic control device for generating the control signal and/or an electronic measuring device for measuring an operating parameter of the electronic power module. The second electronic sub-assembly being connected to the first electronic sub-assembly by a first control pin. An electric assembly includes the electronic system and a rotating electric machine.

20 Claims, 4 Drawing Sheets

(51) Int. Cl.
  *H02K 11/27* (2016.01)
  *H02K 11/33* (2016.01)
  *H02M 1/00* (2007.01)
  *H02M 7/537* (2006.01)
  *H05K 7/20* (2006.01)
(52) U.S. Cl.
  CPC ......... *H02M 1/0009* (2021.05); *H02M 7/537* (2013.01); *H05K 7/209* (2013.01)
(58) Field of Classification Search
  CPC ............... H05K 7/209; H05K 7/14322; H05K 7/20945; H05K 7/20954
  USPC ....................................................... 310/68 B
  See application file for complete search history.

ELECTRONIC CONTROL SYSTEM FOR ELECTRIC MACHINE AND ELECTRIC ASSEMBLY

The invention relates to an electronic control system for an electric machine and to an electric assembly comprising such an electronic system and an electric machine.

In a known way, an electronic control system for an electric machine comprises:
- an electronic power module for converting a DC current to an AC current, the electronic power module comprising:
  - a first busbar and a second busbar for supplying the electronic power module with the DC current,
  - a third busbar for supplying a phase winding of a rotating electrical machine,
  - a control pin receiving a control signal for controlling the electronic power module,
- an electronic control module, separate from the electronic power module and configured to generate the control signal.

To provide satisfactory control of the electronic power module, it is important to evaluate the temperature of an electronic power component, such as a controllable switch of a switching arm, of the electronic power module. French patent application no. 1855045 proposes measuring this temperature using a temperature sensor, for example a thermistor, carried on the electronic circuit card of the electronic control module, the heat of the electronic power components being conducted toward the temperature sensor by an electrical conductor connected to one of the busbars or the control pin. In this type of temperature measurement means, the temperature sensor is at a distance from the electronic power component whose temperature needs to be known. The accuracy of the temperature measurement is therefore reduced due to heat losses between the electronic power component and the temperature sensor.

It has been suggested that the temperature sensor could be positioned in the electronic power module, near the electronic power component. However, the method of manufacturing the electronic power module may make it difficult, or even impossible, to incorporate the temperature sensor into the electronic power module. This is the case, notably, when the electronic power module is produced by TML (Transfer Molded Leadframe) technology, in which an electric insulator is overmolded onto the busbars, the control pin and the electronic power component. The electric insulator is, for example, a thermosetting resin of the epoxy type.

It is known to use an interconnector, separate from the electronic power module, for connecting the third busbar of the electronic power module to the phase winding of the rotating electrical machine. Such an interconnector is described in French patent application FR3068564 A1. The interconnector comprises a conducting part electrically connecting the third busbar to the phase winding of the rotating electrical machine, together with a magnetic core. The magnetic core surrounds the conducting part. The core has a recess in which a Hall effect sensor can be placed. A voltage, dependent on the magnetic field, is generated by the current flowing in the conducting part. The interconnector may also comprise a casing overmolded onto the conducting part and the core. By using such an interconnector, it is possible to simplify the electronic power module and the process of manufacturing it. This is because, particularly in the case of an electronic power module produced by the TML method, it is difficult to overmold the casing on a third busbar that has been bent to receive a magnetic core to be integrated into the overmolding. However, the use of such an interconnector has the drawback of being bulky, thus reducing the space for the flow of cooling air in the electronic control system. In patent application FR3068564 A1, the axis of the magnetic core is parallel to the general plane of orientation of the electronic power module. Consequently, the interconnector has thick parts, with a thickness at least equal to the outside diameter of the magnetic core. These thick parts reducing the space for the flow of cooling air in the electronic control system.

It is known to connect the control pin directly to the electronic control module, as in the patent application FR3068541 A1, for example. The position of the connection of the control pin to the electronic control module is therefore constrained by the position of the control pin on the electronic power module. The position of the control pin connection may therefore be in a central area of the electronic control module, which has the drawback of reducing the space available for positioning the electronic control components of the electronic control module.

The present invention seeks to overcome all or some of these drawbacks.

The invention relates to an electronic system comprising:
- an electronic power module for converting a DC current to an AC current, the electronic power module comprising:
  - a first busbar and a second busbar for supplying the electronic power module with the DC current,
  - a third busbar for supplying a phase winding of a rotating electrical machine,
  - a control pin receiving a control signal for controlling the electronic power module,
- an electronic control module, separate from the electronic power module and configured to generate the control signal, the electronic control module comprising:
  - a first electronic sub-assembly comprising at least one first trace and at least one electronic control component, the at least one electronic control component being electrically connected to the at least one first trace,
  - a second electronic sub-assembly, separate from the first electronic sub-assembly and comprising an electronic control device for generating the control signal and/or an electronic measuring device for measuring an operating parameter of the electronic power module, the second electronic sub-assembly being connected to the first electronic sub-assembly by a first control pin.

By using an electronic control module comprising such a second electronic sub-assembly, it is possible to bring the electronic control device that generates the control signal for the electronic power module closer to the electronic power module. Thus it is possible to shorten the length of the electrical links between the electronic control device and the electronic power module. This may enable the cost of the electronic system to be reduced significantly. For example, in the case of an electronic power module produced by TML technology, it is possible to reduce the dimensions of the conducting metal plate, such as a copper plate, from which the various busbars of the electronic power module are made.

An example of embodiment of a first electronic sub-assembly separate from a second electronic sub-assembly is produced, for example, by providing a first support for first electronic sub-assembly and a second support for the second electronic sub-assembly, the first and second support being at a distance from each other.

According to an additional characteristic of the invention, the electronic measuring device is a current sensor.

According to an additional characteristic of the invention, the electronic power module extends in a first plane and one end of the third busbar is perpendicular to the first plane.

According to an additional characteristic of the invention, the current sensor comprises a magnetic core having an air gap and a Hall effect sensor positioned in the air gap to measure the current flowing through a conductor passing through the magnetic core, the third busbar passing through the magnetic core or the magnetic core being capable of having the phase winding of the rotating electrical machine passing through it.

According to an additional characteristic of the invention, the height of the current sensor along the axis of the magnetic core is less than its width and its length in the plane perpendicular to the axis of the magnetic core.

By using a current sensor whose magnetic core is passed through by the third busbar or a phase winding oriented in the direction perpendicular to the first plane in which the electronic power module extends, it is possible to reduce the overall dimensions in the direction perpendicular to the first plane. As a result of this reduction in overall dimensions, it is possible, for example, to provide a larger space for the cooling air flow, notably in the case of an air-cooled electronic control system. Better cooling of the electronic control system can thus be provided.

According to an additional characteristic of the invention, the electronic measuring device is a temperature sensor.

By installing the temperature sensor on the second electronic sub-assembly, it is possible to bring the temperature sensor closer to the electronic power module. Thus the accuracy of the temperature measurement can be improved. This improvement is obtained, in particular, when the temperature sensor is thermally connected to an electrical conductor which electrically connects the electronic power module to the second electronic sub-assembly. The length of the electrical conductor may be reduced to limit heat losses into the environment.

According to an additional characteristic of the invention:
the second electronic sub-assembly comprises a second trace, electrically connected to the first control pin,
the first electronic sub-assembly comprises an electronic control circuit,
the first control pin is electrically connected to the electronic control circuit.

According to an additional characteristic of the invention:
at least a second control pin is electrically connected to one of the first busbar, the second busbar, the third busbar and the control pin,
the second trace is electrically connected to the second control pin.

By using a second trace of the second electronic sub-assembly for electrically connecting the first control pin to the second control pin, the second electronic sub-assembly can act as an interconnector between the electronic power module and the first electronic sub-assembly. The electrical connections to the first electronic sub-assembly can thus be positioned in an improved way. For example, these electrical connections may be positioned on a peripheral area of the first electronic sub-assembly, so as to increase the space available for the electronic components of the first electronic sub-assembly.

According to an additional characteristic of the invention, the first control pin is separate from the second trace, and/or the second trace is separate from the second control pin.

According to an additional characteristic of the invention, the second electronic sub-assembly further comprises a thermal connection between the second trace and the temperature sensor.

The thermal connection enables heat to be conducted between the second trace and the temperature sensor. This makes it possible to evaluate the temperature of a component electrically connected to the second trace, for example the temperature of a component of the electronic power module.

According to an additional characteristic of the invention, the second electronic sub-assembly further comprises a casing incorporating the second trace and the electronic control device and/or an electronic measuring device, notably a casing overmolded onto the second trace and the electronic control device and/or an electronic measuring device.

According to an additional characteristic of the invention, the second electronic sub-assembly comprises a circuit card on which the second trace is arranged, and which carries the control device and/or the measuring device.

The invention also relates to an electric assembly comprising:
an electronic system as described above,
a rotating electric machine.

Figure 2:
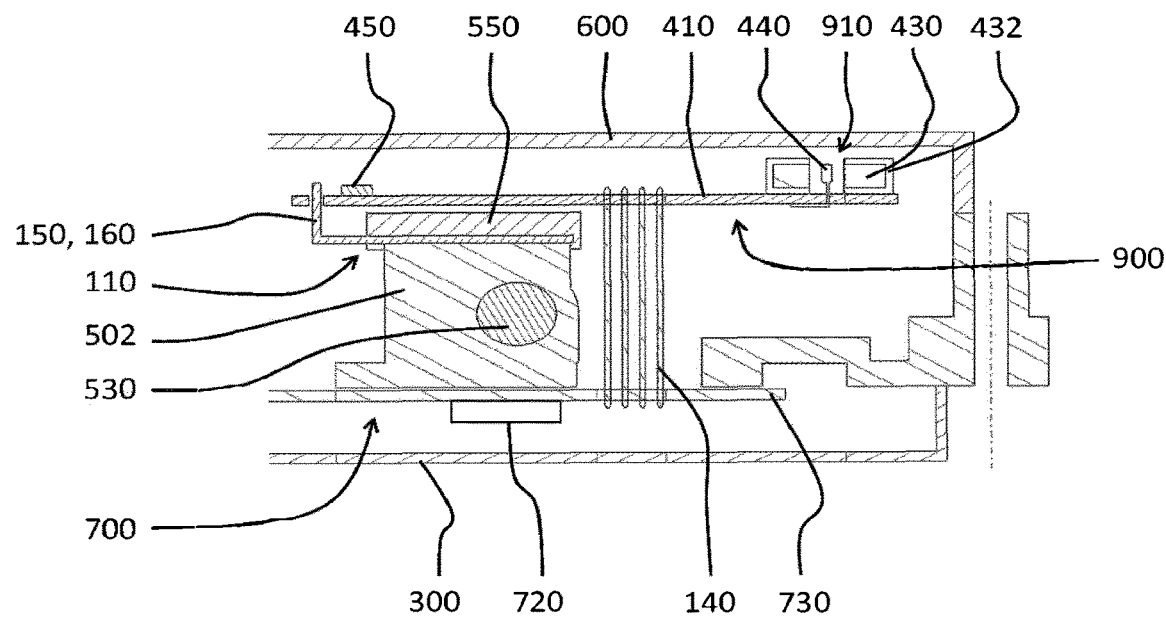
Figure 3:
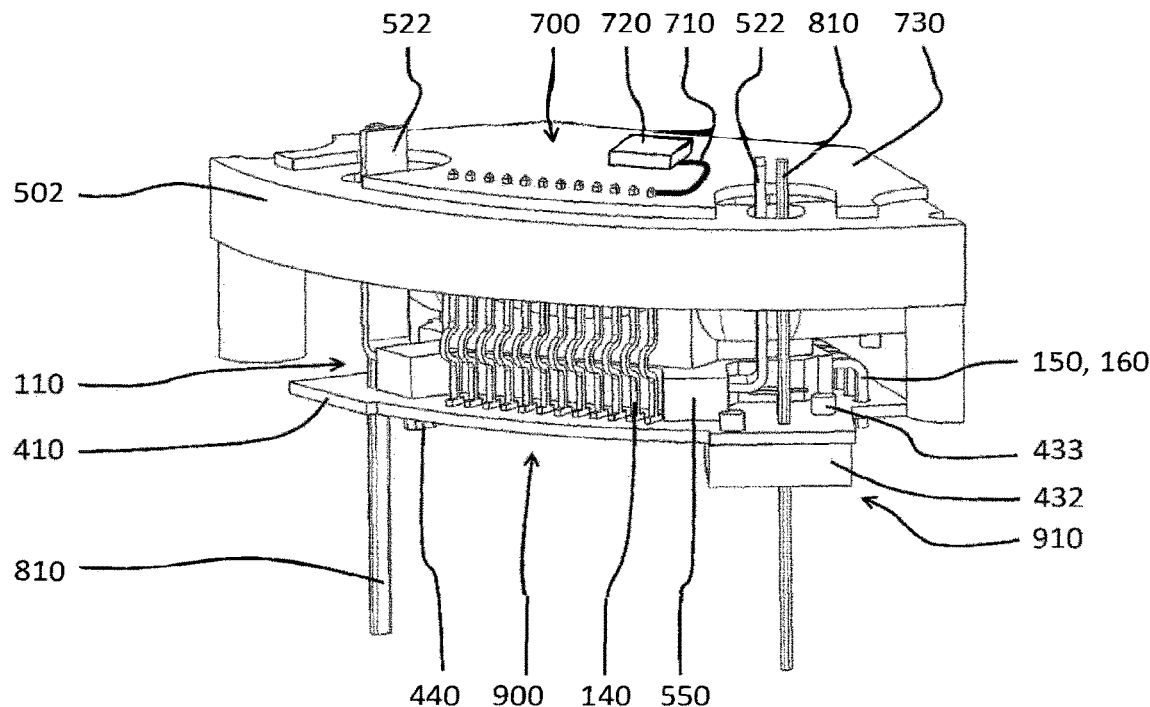
Figure 4:
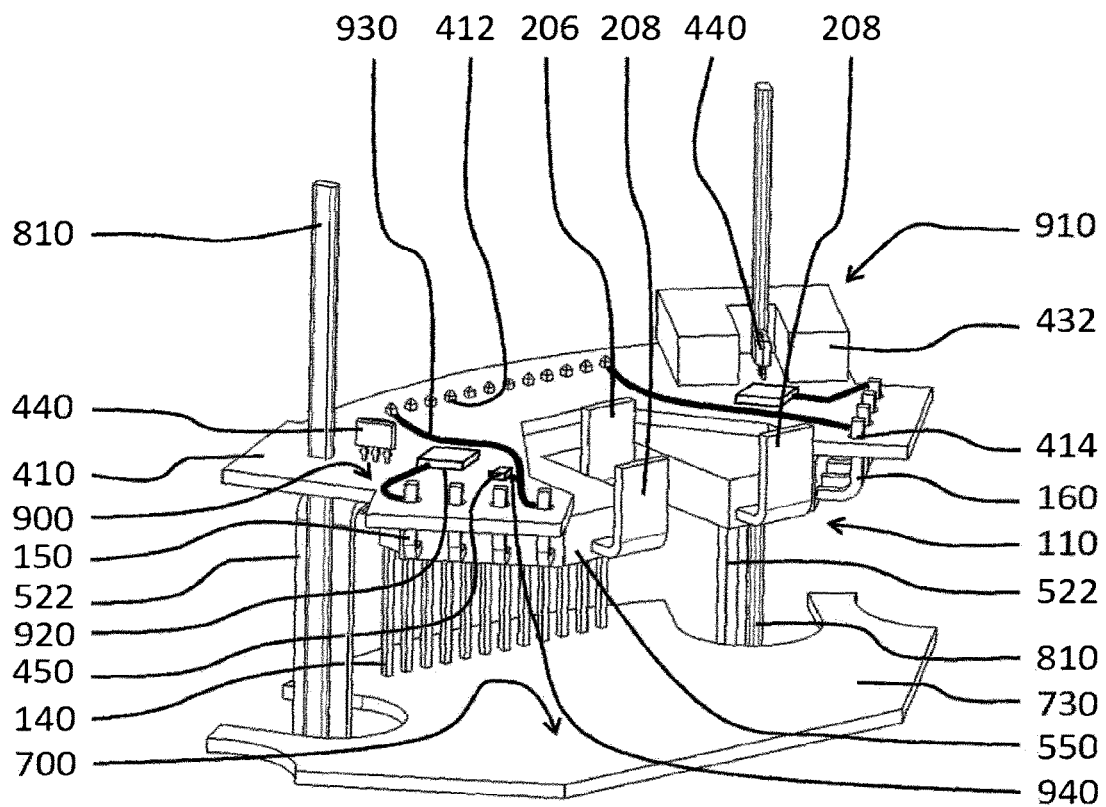
Figure 5:
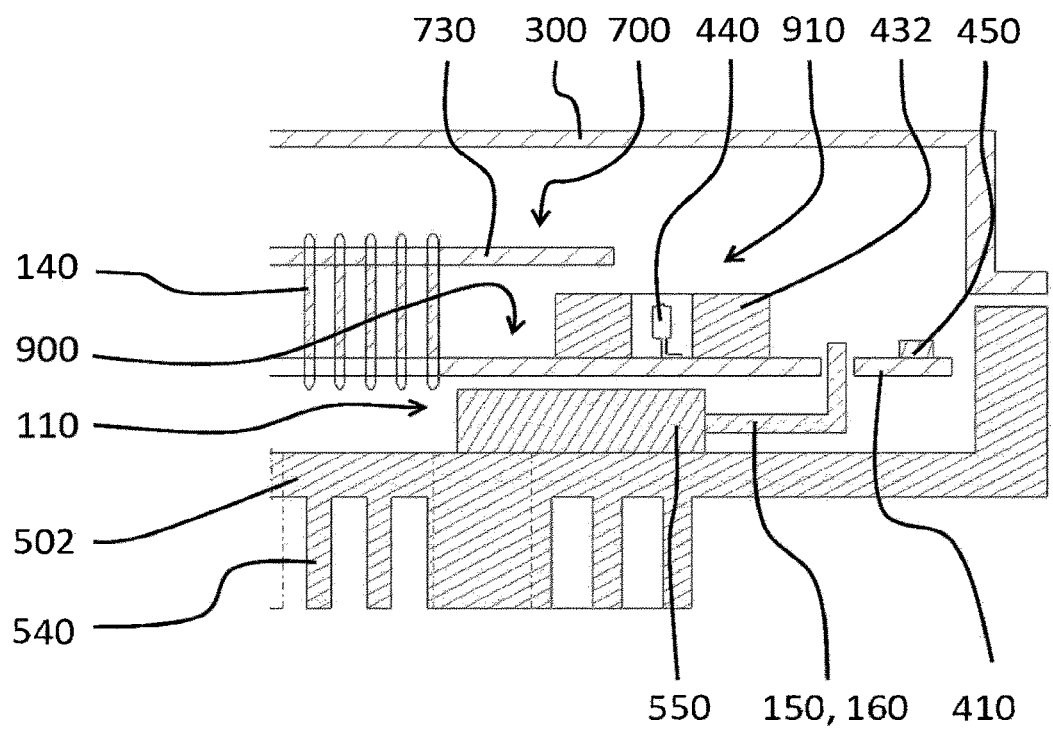
Figure 6:
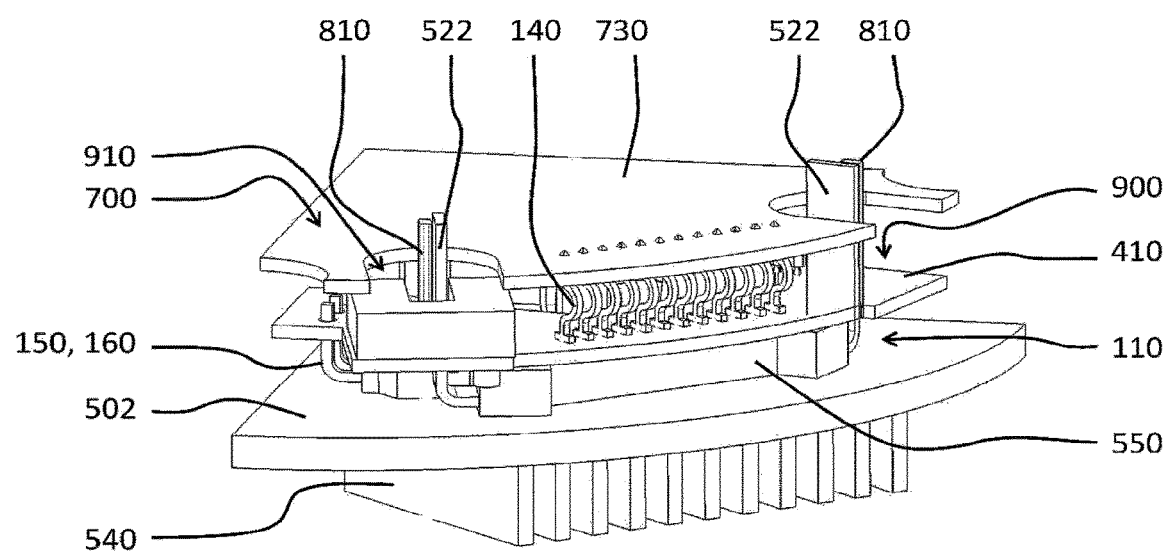
Figure 7:
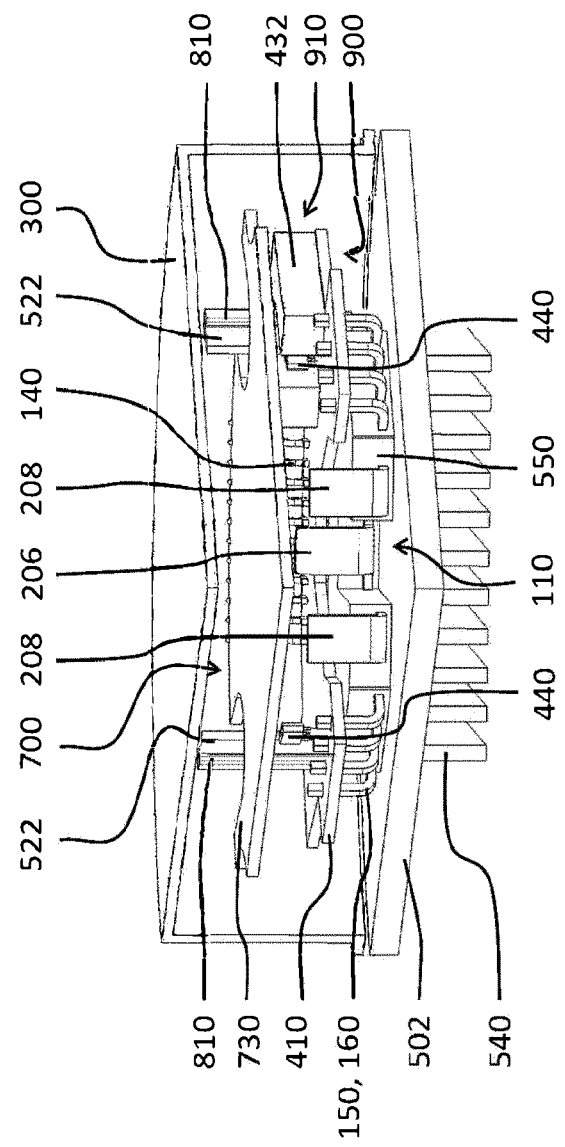

The invention may be better understood from reading the following description of non-limiting exemplary embodiments thereof and on studying the appended drawing, in which:

FIG. 1 shows a circuit diagram of an electric assembly comprising an electronic system according to the invention, FIG. 2 shows a schematic view in partial cross section of an electronic system according to a first embodiment of the invention, FIG. 3 shows a partial schematic view of the electronic system of FIG. 2, FIG. 4 shows another partial schematic view of the electronic system of FIG. 2, FIG. 5 depicts a schematic partial view in section of an electronic system according to a second embodiment, FIG. 6 shows a partial schematic view of the electronic system of FIG. 5, FIG. 7 shows another partial schematic view of the electronic system of FIG. 5.

In all of the figures, elements that are identical or perform the same function bear the same reference numerals. The following embodiments are examples. Although the description refers to one or more embodiments, this does not necessarily mean that each reference sign relates to the same embodiment, or that the features only apply to just one embodiment. Individual features of different embodiments can also be combined or interchanged in order to create other embodiments.

FIG. 1 shows an electric assembly 100 in which the invention may be implemented.

The electric assembly 100 is, for example, intended to be installed in a motor vehicle.

The electric assembly 100 firstly has an electric power source 102 designed to deliver a DC voltage U, for example between 20 V and 100 V, for example 48 V. The electrical power source 102 has, for example, a battery.

The electric assembly 100 further comprises a rotating electric machine 130 comprising a plurality of phase windings (not shown) that are intended to have respective phase voltages.

The electric assembly 100 further comprises an electronic system 104.

In the various embodiments shown in the figures, the electronic system 104 is a voltage converter 104. However, in other embodiments which are not shown, the assembly may perform a different function.

The voltage converter 104 is connected between the electric power source 102 and the electric machine 130 in order to perform a conversion between the direct voltage U and the phase voltages.

The voltage converter 104 firstly comprises a positive electric line 106 and a negative electric line 108 which are intended to be connected to the electric power source 102 in order to receive the direct voltage U, with the positive electric line 106 receiving a high electric potential and the negative electric line 108 receiving a low electric potential. The negative electric line receives a zero potential for example, and is connected to a ground of the motor vehicle.

The voltage converter 104 further comprises at least one electronic power module 110 comprising one or more phase electric lines 122 that are intended to be respectively connected to one or more phases of the electric machine 130 in order to provide their respective phase voltages.

In the described example, the voltage converter 104 comprises three electronic power modules 110, each comprising two phase electric lines 122 connected to two phases of the electric machine 130.

More specifically, in the described example, the electric machine 130 comprises two three-phase systems each comprising three phases and intended to be electrically phase-shifted from one another by 120°. Preferably, the first phase electric lines 122 of the power electronic modules 110 are respectively connected to the three phases of the first three-phase system, whereas the second phase electric lines 122 of the power electronic modules 110 are respectively connected to the three phases of the second three-phase system.

Each electronic power module 110 comprises, for each phase electric line 122, a first controllable switch 112 connected between the positive electric line 106 and the phase electric line 122 and a second controllable switch 114 connected between the phase electric line 122 and negative power line 108. The controllable switches 112, 114 are thus arranged so as to form a chopping arm, in which the phase electric line 122 forms a center tap.

Each controllable switch 112, 114 comprises first and second main terminals 116, 118 and a control terminal 120 intended to selectively open and close the controllable switch 112, 114 between its two main terminals 116, 118 depending on a control signal that is applied thereto. The controllable switches 112, 114 are preferably transistors, for example, Metal-Oxide Semiconductor Field-Effect Transistors (MOSFETs) having a gate forming the control terminal 120, and a drain and a source respectively forming the main terminals 116, 118.

In the example described, the controllable switches 112, 114 each have the form of a plate that is for example substantially rectangular and that has an upper face and a lower face. The first main terminal 116 extends over the lower face, whereas the second main terminal 118 extends over the upper face. Furthermore, the lower face forms a heat sink face.

The voltage converter 104 further comprises, for each electronic power module 110, a filtering capacitor 124 having a first terminal 126 and a second terminal 128 respectively connected to the positive electric line 106 and to the negative electric line 108.

It will be appreciated that the positive electric line 106, the negative electric line 108 and the phase electric lines 122 are rigid elements designed to withstand electric currents of at least 1 A. They preferably have a thickness of at least 1 mm.

Furthermore, in the example described, the electric machine 130 simultaneously has an alternator and electric motor function. More specifically, the motor vehicle further comprises a combustion engine (not shown) having an output shaft, to which the electric machine 130 is connected, for example, via a belt or a chain or a geartrain (not shown). The combustion engine is intended to drive the wheels of the motor vehicle by means of its output shaft. Thus, during operation as an alternator, the electric machine supplies the electric power source 102 with electrical energy based on the rotation of the output shaft. The voltage converter 104 then operates as a rectifier. During operation as an electric motor, the electric machine drives the output shaft (in addition to or else instead of the combustion engine). The voltage converter 104 then operates as an inverter.

The electric machine 130 is located, for example, in a gearbox or else in a clutch of the motor vehicle or else in place of the alternator.

FIG. 2, FIG. 3 and FIG. 4 show an electronic system 104 according to a first embodiment.

The electronic system 104 comprises:
the electronic power module 110 for converting a DC current into an AC current, the electronic power module 110 comprising:
a first busbar 206 and a second busbar 208 for supplying the electronic power module with the DC current,
a third busbar 522 for supplying a phase winding 810 of a rotating electric machine,
a control pin 150 receiving a control signal for controlling the electronic power module 110.

The first busbar 206 is electrically connected to the positive electric line 106. The second busbar 208 is electrically connected to the negative electric line 108. The third busbar 522 is electrically connected to the phase electric line 122. The control pin 150 is electrically connected to the control terminal 120.

The electronic power module 110 may further comprise a casing 550 overmolded onto the first controllable switch 112, the second controllable switch 114, the first busbar 206, the second busbar 208, the third busbar 522 and the control pin 150. The electronic power module is, for example, constructed using TML technology.

The electrical system 104 may further comprise a heat sink 502.

The electronic power module 110 is attached to the heat sink 502 using an attachment means, not shown.

The electronic power module 110 comprises a heat dissipation surface. This heat dissipation surface is in thermal contact with a heat exchange surface of the heat sink 502. The thermal contact is, for example, made using a thermal paste or a thermal adhesive.

In this first embodiment, the heat sink 502 may comprise a pipe 530. The pipe 530 is, for example, connected to a cooling circuit in which a heat transfer fluid, notably a water-based cooling liquid, can flow.

The electrical system 104 further comprises:
an electronic control module, separate from the electronic power module and configured to generate the control signal, the electronic control module comprising:
a first electronic sub-assembly 700 comprising at least a first trace 710 and at least one electronic control component 720, the at least one electronic control component being electrically connected to the at least one first trace 710, a second electronic sub-assembly 900, separate from the first electronic sub-assembly 700 and comprising an electronic measuring device for measuring an operating parameter of the electronic power module.

In other words, the first electronic sub-assembly 700 comprises a first support, and the second electronic sub-assembly 900 comprises a second support, the first and the second support being at a distance from each other.

The second electronic sub-assembly 900 is connected to the first electronic sub-assembly by a first control pin 140.

The second electronic sub-assembly 900 comprises a second trace 930.

At least a second control pin 160 is electrically connected to one of the first busbar 206, the second busbar 208, the third busbar 522 and the control pin 150.

In the embodiments shown in FIGS. 2 to 7, a plurality of second control pins 160 are used. One of the second control pins 160 is the control pin 150. Another second control pin 160 is, for example, connected to the first busbar 206. Another second control pin 160 is, for example, connected to the third busbar 522.

The second control pin 160 may be connected to the second trace 930.

The second trace 930 is electrically connected to the first control pin 140.

In the embodiments of FIGS. 2 to 7, the first control pin 140 is separate from the second trace 930, and the second trace 930 is separate from the second control pin 160.

The first electronic sub-assembly 700 may comprise a first electronic circuit card 730 carrying the electronic control component 720.

The first support of the first electronic sub-assembly 700 is, for example, the first electronic circuit card 730.

The first control pin 140 is electrically connected to the electronic control component 720.

The second electronic sub-assembly 900 may comprise a second electronic circuit card 410. The second trace 930 is, for example, a metallic trace formed on the second electronic circuit card 410.

The second support of the second electronic sub-assembly 900 is, for example, the second electronic circuit card 410.

In another embodiment which is not shown, the second sub-assembly 900 comprises a casing overmolded onto the second trace 930. The overmolded casing is, for example, made of epoxy resin. The second sub-assembly 900 is, for example, constructed using TML technology.

In another embodiment which is not shown, the first control pin 140 is made in one piece with the second trace 930.

In another embodiment which is not shown, the second control pin 160 is made in one piece with the second trace 930.

In another embodiment which is not shown, the first control pin 140 and the second control pin 160 are made in one piece with the second trace 930.

The electronic measuring device of the second electronic sub-assembly 900 is, for example, a current sensor 910.

The current sensor 910 may comprise a magnetic core 430 and a Hall effect sensor 440. The magnetic core 430 has an air gap in which the Hall effect sensor 440 is placed, for measuring the current flowing through an electrical conductor passing through the magnetic core 430.

The height of the current sensor 910 along the axis of the magnetic core 430 is less than its width and its length in the plane perpendicular to the axis of the magnetic core 430.

The height of the current sensor 910 is, for example, at least twice as small as its width and its length.

A magnetic core support 432 may be overmolded onto the magnetic core 430. The magnetic core support 432 is, for example, attached to the second electronic circuit card 410 by fastening means 433. The fastening means 433 are, for example, screws or protuberances of the magnetic core support 432, hot crimped onto the second electronic circuit card 410.

In the embodiments of FIGS. 2 to 7, the current sensor 910 may be used to measure the current flowing in the phase winding 810.

In the embodiments of FIGS. 2 to 7, the phase winding 810 passes through the magnetic core 430.

In another embodiment which is not shown, the third busbar 522 passes through the magnetic core.

The electronic power module 110 extends in a first plane. The third busbar 522 has an end perpendicular to the first plane. The perpendicular end of the third busbar 522 is connected to the phase winding 810 which has the same orientation as the end of the third busbar.

The third busbar 522 and the phase winding 810 are, for example, electrically and mechanically connected by brazing/welding or by crimping (not shown).

The second electronic sub-assembly 900 has an orientation parallel to the first plane. The axis of the current sensor 910 is perpendicular to the orientation of the second electronic sub-assembly 900.

Since the height of the current sensor 910 is less than its length and its width, it is possible to have a second electronic sub-assembly 900 with a reduced thickness.

The electronic measuring device of the second electronic sub-assembly 900 may also be a temperature sensor 450, for example a thermistor.

The second electronic sub-assembly may further comprise a thermal connection between the second trace 930 and the temperature sensor 450.

The thermal connection comprises, for example, a thermally conductive trace 940, notably a metal trace, notably a copper trace. The temperature sensor 450 is in thermal contact with the thermally conductive trace 940. The thermal contact is, for example, made by direct contact or by means of a thermal paste or a thermal adhesive. The thermally conductive trace 940 is, for example, welded to the second trace 930 to enable heat to be conducted between the second trace 930 and the thermally conductive trace 940. In the embodiment of FIG. 4, the second trace 930 and the thermally conductive trace 940 are formed in one piece. In another embodiment, the second trace 930 and the thermally conductive trace 940 form a single trace.

Such a temperature sensor 450 may enable the temperature of the electronic power module 110 to be evaluated. The heat generated by the electronic power module 110 is transmitted by thermal conduction via the second control pin 160 and the second trace 930 to the thermal connection and the temperature sensor.

The second electronic sub-assemblies of the embodiments shown in FIGS. 2 to 7 comprise both a temperature sensor 450 and a current sensor 910.

In the embodiment of FIG. 2, FIG. 3 and FIG. 4, the second electronic sub-assembly 900 also comprises an electronic control device 920 for generating the control signal. As described above, the control signal is sent to the control terminal 120 of a controllable switch of the electronic power module 110 for selectively opening and closing the controllable switch 112, 114.

In another embodiment which is not shown, the second electronic sub-assembly 900 does not comprise an electronic measuring device for measuring an operating parameter of the electronic power module 110, but comprises an electronic control device 920 for generating the control signal.

In another embodiment which is not shown, the second electronic sub-assembly 900 comprises the electronic measuring device 910, 450 for measuring an operating parameter of the electronic power module 110, but does not comprise an electronic control device for generating the control signal.

The first electronic sub-assembly 700 has an orientation parallel to the orientation of the second electronic sub-assembly 900.

The electronic system 104 may have a generally circular cylindrical shape, the axis of which is perpendicular to the first plane. The first electronic sub-assembly 700 and the second electronic sub-assembly 900 may be disk-shaped.

The second electronic sub-assembly 900, the first control pin 140 and the second control pin 160 may form an interconnection module between the electronic power module 110 and the first electronic sub-assembly 700. The interconnection module enables the constraints on the positioning of the electrical connection of the first control pin 140 to the first electronic sub-assembly 700 to be reduced by comparison with the positioning of the second control pin 160. Thus, for example, the electrical connection of the first control pin 140 to the first electronic sub-assembly 700 may be positioned on the outside of the first electronic sub-assembly 700. This position makes it possible to reduce the routing constraints on the first electronic sub-assembly 700 and to increase the space available for the electronic components of the first electronic sub-assembly 700.

In the first embodiment shown in FIGS. 2 to 4, the first electronic sub-assembly 700, the heat exchanger 502, the electronic power module 110 and the second electronic sub-assembly 900 are positioned successively in parallel planes.

The position of the heat exchanger between the first electronic sub-assembly 700 and the electronic power module 110 allows not only the cooling of the electronic power module 110 as mentioned above, but also the cooling of the first electronic sub-assembly 700. The first electronic sub-assembly 700 comprises a heat dissipation surface. This heat dissipation surface is in thermal contact with a heat exchange surface of the heat sink 502. The thermal contact is, for example, made using a thermal paste or a thermal adhesive.

A first cover 300 may be attached to the heat sink 502 to protect the second electronic sub-assembly 900, notably, from water splashes and the ingress of other contaminants.

A second cover 600 may be attached to the heat sink 502 on the opposite side to the first cover 300.

The first cover 300, the heat sink 502 and the second cover 600 may form a composite casing to protect the second electronic sub-assembly 900, the electronic power module 110, the first electronic sub-assembly 700 and connecting elements such as the first control pin 140 and the second control pin 160.

FIG. 5, FIG. 6 and FIG. 7 show an electronic system 104 according to a second embodiment.

In the second embodiment, the heat sink 502 is cooled by exchanging heat with the ambient air. Cooling fins 540 located on the surface of the heat sink 502 opposite the heat exchange surface between the electronic power module 110 and the heat sink 502 may enable the cooling to be improved by increasing the surface area for exchanging heat with the ambient air.

In the second embodiment, the heat exchanger 502, the electronic power module 110, the second electronic sub-assembly 900 and the first electronic sub-assembly 700 are positioned successively in parallel planes.

A cover 300 attached to the heat sink 502 may be used to protect the electronic power module 110, the second electronic sub-assembly 900, the first electronic sub-assembly 700 and the connecting elements such as the first control pin 140 and the second control pin 160.

In a variant embodiment which is not shown, openings are made in the cover to allow the passage of an air flow between the electronic power module 110 and the first electronic sub-assembly 700.

The low height of the current sensor 910 as described above limits the obstruction of the air passage by the current sensor 910.

In another variant embodiment which is not shown, the first electronic sub-assembly 700 is supported by a support casing, which is, for example, attached to the heat sink 502.

The invention claimed is:

1. An electronic system comprising:
   an electronic power module for converting a DC current into an AC current, the electronic power module comprising:
   a first busbar and a second busbar for supplying the electronic power module with the DC current,
   a third busbar for supplying a phase winding of a rotating electric machine,
   a control pin receiving a control signal for controlling the electronic power module,
   an electronic control module, separate from the electronic power module and configured to generate the control signal, the electronic control module comprising:
   a first electronic sub-assembly comprising a first circuit card provided in a first plane and including at least a first trace and at least one electronic control component, the at least one electronic control component being electrically connected to the at least one first trace,
   a second electronic sub-assembly, separate from the first electronic sub-assembly and comprising a second circuit card provided in a second plane and including an electronic control device for generating the control signal and/or an electronic measuring device for measuring an operating parameter of the electronic power module,
   the second electronic sub-assembly being connected to the first electronic sub-assembly by a first control pin which extends from the first circuit card to the second circuit card.

2. The electronic system as claimed in claim 1, wherein the electronic measuring device is a current sensor.

3. The electronic system as claimed in claim 2, wherein the electronic power module extends in a first plane, and wherein one end of the third busbar is perpendicular to the first plane.

4. The electronic system as claimed in claim 3, wherein:
   the second electronic sub-assembly comprises a second trace, electrically connected to the first control pin,
   the first electronic sub-assembly comprises an electronic control circuit,
   the first control pin is electrically connected to the electronic control circuit.

5. The electronic system as claimed in claim 2, wherein:
the second electronic sub-assembly comprises a second trace, electrically connected to the first control pin,
the first electronic sub-assembly comprises an electronic control circuit,
the first control pin is electrically connected to the electronic control circuit.

6. The electronic system as claimed in claim 2, wherein the second electronic sub-assembly comprises an electronic circuit card on which the second trace is arranged, and which carries the control device and/or the temperature sensor.

7. An electrical assembly comprising:
an electronic system as claimed in claim 2,
a rotating electric machine.

8. The electronic system as claimed in claim 1, wherein:
the electronic measuring device is a temperature sensor.

9. An electrical assembly comprising:
the electronic system as claimed in claim 1,
a rotating electric machine.

10. An electronic system comprising:
an electronic power module for converting a DC current into an AC current, the electronic power module comprising:
  a first busbar and a second busbar for supplying the electronic power module with the DC current,
  a third busbar for supplying a phase winding of a rotating electric machine,
  a control pin receiving a control signal for controlling the electronic power module,
an electronic control module, separate from the electronic power module and configured to generate the control signal, the electronic control module comprising:
  a first electronic sub-assembly comprising at least a first trace and at least one electronic control component, the at least one electronic control component being electrically connected to the at least one first trace,
  a second electronic sub-assembly, separate from the first electronic sub-assembly and comprising an electronic control device for generating the control signal and/or an electronic measuring device for measuring an operating parameter of the electronic power module,
the second electronic sub-assembly being connected to the first electronic sub-assembly by a first control pin,
wherein:
the electronic measuring device is a current sensor,
the electronic power module extends in a first plane, and one end of the third busbar is perpendicular to the first plane, and
the current sensor comprises a magnetic core having an air gap and a Hall effect sensor positioned in the air gap to measure the current flowing through a conductor passing through the magnetic core, the third busbar passing through the magnetic core or the magnetic core being capable of having the phase winding of the rotating electrical machine passing through it.

11. An electronic system comprising:
an electronic power module for converting a DC current into an AC current, the electronic power module comprising:
  a first busbar and a second busbar for supplying the electronic power module with the DC current,
  a third busbar for supplying a phase winding of a rotating electric machine,
  a control pin receiving a control signal for controlling the electronic power module,
an electronic control module, separate from the electronic power module and configured to generate the control signal, the electronic control module comprising:
  a first electronic sub-assembly comprising at least a first trace and at least one electronic control component, the at least one electronic control component being electrically connected to the at least one first trace,
  a second electronic sub-assembly, separate from the first electronic sub-assembly and comprising an electronic control device for generating the control signal and/or an electronic measuring device for measuring an operating parameter of the electronic power module,
the second electronic sub-assembly being connected to the first electronic sub-assembly by a first control pin,
wherein:
the electronic measuring device is a temperature sensor,
the second electronic sub-assembly comprises a second trace, electrically connected to the first control pin,
the first electronic sub-assembly comprises an electronic control circuit,
the first control pin is electrically connected to the electronic control circuit.

12. The electronic system as claimed in claim 11, wherein:
at least a second control pin is electrically connected to one of the first busbar, the second busbar, the third busbar and a control pin,
the second trace is electrically connected to the second control pin.

13. The electronic system as claimed in claim 12, wherein the first control pin is separate from the second trace, and the second trace is separate from the second control pin.

14. The electronic system as claimed in claim 13, wherein the second electronic sub-assembly further comprises a thermal connection between the second trace and the temperature sensor.

15. The electronic system as claimed in claim 13, wherein the second electronic sub-assembly further comprises a casing incorporating the second trace and the electronic control device and/or an electronic measuring device, notably a casing overmolded onto the second trace and the electronic control device and/or the electronic measuring device.

16. The electronic system as claimed in claim 12, wherein the second electronic sub-assembly further comprises a thermal connection between the second trace and the temperature sensor.

17. The electronic system as claimed in claim 12, wherein the second electronic sub-assembly further comprises a casing incorporating the second trace and the electronic control device and/or an electronic measuring device, notably a casing overmolded onto the second trace and the electronic control device and/or the electronic measuring device.

18. The electronic system as claimed in claim 11, wherein the second electronic sub-assembly further comprises a thermal connection between the second trace and the temperature sensor.

19. The electronic system as claimed in claim 11, wherein the second electronic sub-assembly further comprises a casing incorporating the second trace and the electronic control device and/or an electronic measuring device, notably a casing overmolded onto the second trace and the electronic control device and/or the electronic measuring device.

20. The electronic system as claimed in claim 11, wherein the second trace is arranged on the second circuit card which carries the control device and/or the temperature sensor.

* * * * *